US010805042B2

(12) United States Patent
Baptist et al.

(10) Patent No.: US 10,805,042 B2
(45) Date of Patent: Oct. 13, 2020

(54) CREATING TRANSMISSION DATA SLICES FOR USE IN A DISPERSED STORAGE NETWORK

(71) Applicant: International Business Machines Corporation, Armonk, NY (US)

(72) Inventors: Andrew D. Baptist, Mt. Pleasant, WI (US); Greg R. Dhuse, Chicago, IL (US); S. Christopher Gladwin, Chicago, IL (US); Gary W. Grube, Barrington Hills, IL (US); Timothy W. Markison, Mesa, AZ (US); Jason K. Resch, Chicago, IL (US); Ilya Volvovski, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 913 days.

(21) Appl. No.: 15/433,824

(22) Filed: Feb. 15, 2017

(65) Prior Publication Data

US 2017/0163378 A1 Jun. 8, 2017

Related U.S. Application Data

(63) Continuation-in-part of application No. 13/270,528, filed on Oct. 11, 2011, now Pat. No. 10,216,647.

(Continued)

(51) Int. Cl.

*H04L 1/00* (2006.01)
*H04L 29/08* (2006.01)

(Continued)

(52) U.S. Cl.

CPC ........ *H04L 1/0041* (2013.01); *G06F 11/1076* (2013.01); *H04L 1/0057* (2013.01);

(Continued)

(58) Field of Classification Search

CPC . H04L 1/0041; H04L 67/1097; H04L 1/0057; G06F 11/1076; G06F 2211/1028; H03M 13/1515; H03M 13/616

See application file for complete search history.

(56) References Cited

U.S. PATENT DOCUMENTS 4,092,732 A 5/1978 Ouchi
5,454,101 A 9/1995 Mackay et al.

(Continued)

OTHER PUBLICATIONS

Shamir; How to Share a Secret; Communications of the ACM; vol. 22, No. 11; Nov. 1979; pp. 612-613.

(Continued)

*Primary Examiner* — Kannan Shanugasundaram

(74) *Attorney, Agent, or Firm* — Garlick & Markison; Timothy W. Markison; Timothy D. Taylor

(57) ABSTRACT

A method for execution by a computing device of a dispersed storage network (DSN). The method begins by dispersed storage error encoding a data segment of data into a set of encoded data slices, wherein data blocks of the data segment are arranged into a data matrix, wherein the data matrix is multiplied by an encoding matrix to create the set of encoded data slices. The method continues by arranging data blocks of an encoded data slice into a second data matrix and multiplying the second data matrix with a second encoding matrix to produce a set of transmission data slices. The method continues with identifying a plurality of paths for transmitting a decode threshold number of transmission data slices to a storage unit of the DSN. The method continues by transmitting the decode threshold number of transmission data slices to the storage unit via the plurality of paths.

16 Claims, 8 Drawing Sheets

(E) (D) (C)

$$\begin{bmatrix} a & b & c \\ d & e & f \\ g & h & i \\ j & k & l \\ m & n & o \end{bmatrix} * \begin{bmatrix} D1 & D2 & D3 & D4 \\ D5 & D6 & D7 & D8 \\ D9 & D10 & D11 & D12 \end{bmatrix} = \begin{bmatrix} X11 & X12 & X13 & X14 \\ X21 & X22 & X23 & X24 \\ X31 & X32 & X33 & X34 \\ X41 & X42 & X43 & X44 \\ X51 & X52 & X53 & X54 \end{bmatrix}$$

set of EDS: EDS 1_1, EDS 2_1, EDS 3_1, EDS 4_1, EDS 5_1

Related U.S. Application Data

(60) Provisional application No. 61/408,980, filed on Nov. 1, 2010.

(51) Int. Cl.

| | |
|---|---|
| ***H03M 13/00*** | (2006.01) |
| ***G06F 11/10*** | (2006.01) |
| *H03M 13/15* | (2006.01) |

(52) U.S. Cl.

CPC .. *H04L 67/1097* (2013.01); *G06F 2211/1028* (2013.01); *H03M 13/1515* (2013.01); *H03M 13/616* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2010/0268692 | A1 | 10/2010 | Resch |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga, Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

distributed, or dispersed, storage network (DSN) 10

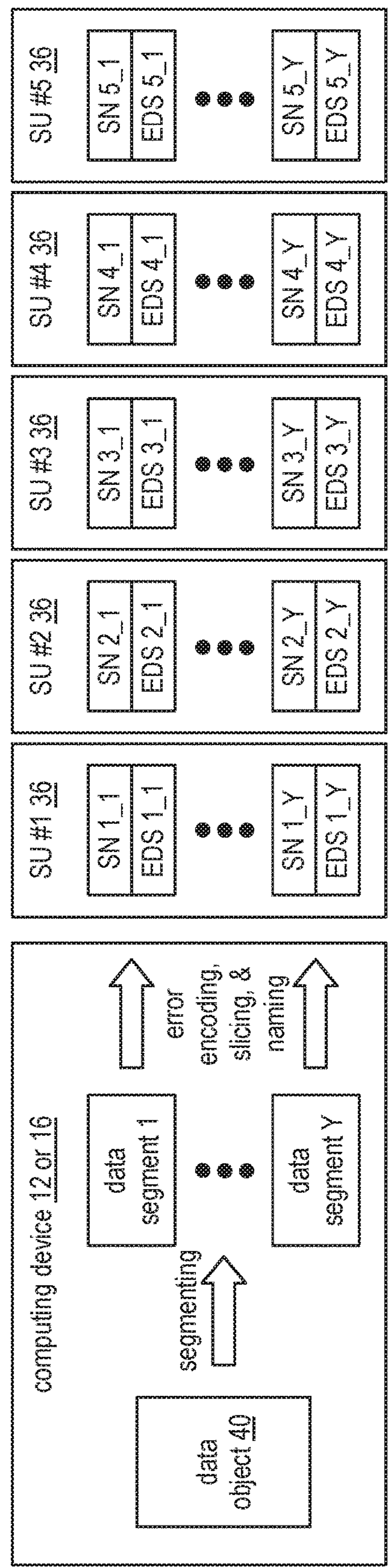
FIG. 3
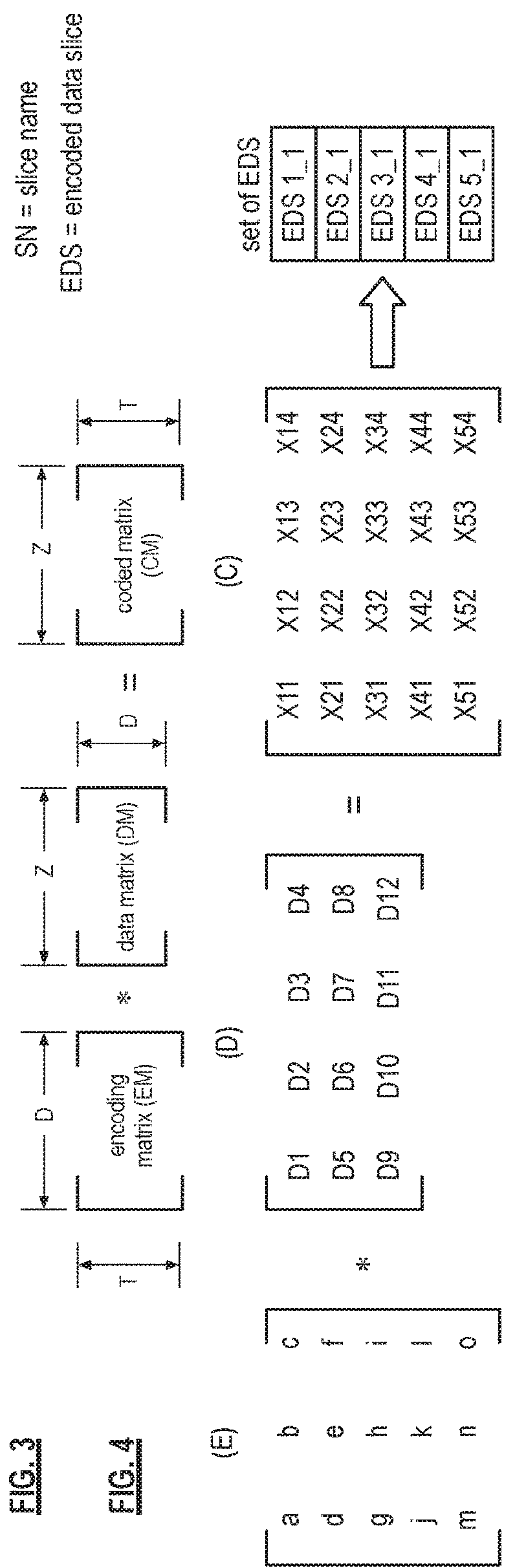
FIG. 4
FIG. 5
slice name 80
| pillar # | data segment # | vault ID | data object ID | rev. info |
|---|---|---|---|---|
FIG. 6

CREATING TRANSMISSION DATA SLICES FOR USE IN A DISPERSED STORAGE NETWORK

CROSS-REFERENCE TO RELATED APPLICATIONS

The present U.S. Utility Patent Application claims priority pursuant to 35 U.S.C. § 120 as a continuation-in-part of U.S. Utility application Ser. No. 13/270,528, entitled "COMPACTING DISPERSED STORAGE SPACE", filed Oct. 11, 2011, which claims priority pursuant to 35 U.S.C. § 119(e) to U.S. Provisional Application No. 61/408,980, entitled "DISPERSED STORAGE NETWORK COMMUNICATION", filed Nov. 1, 2010, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

As is further known, data may be compressed, encrypted, and may have an integrity codec applied to it for faster processing, increased security, and/or other advantages.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
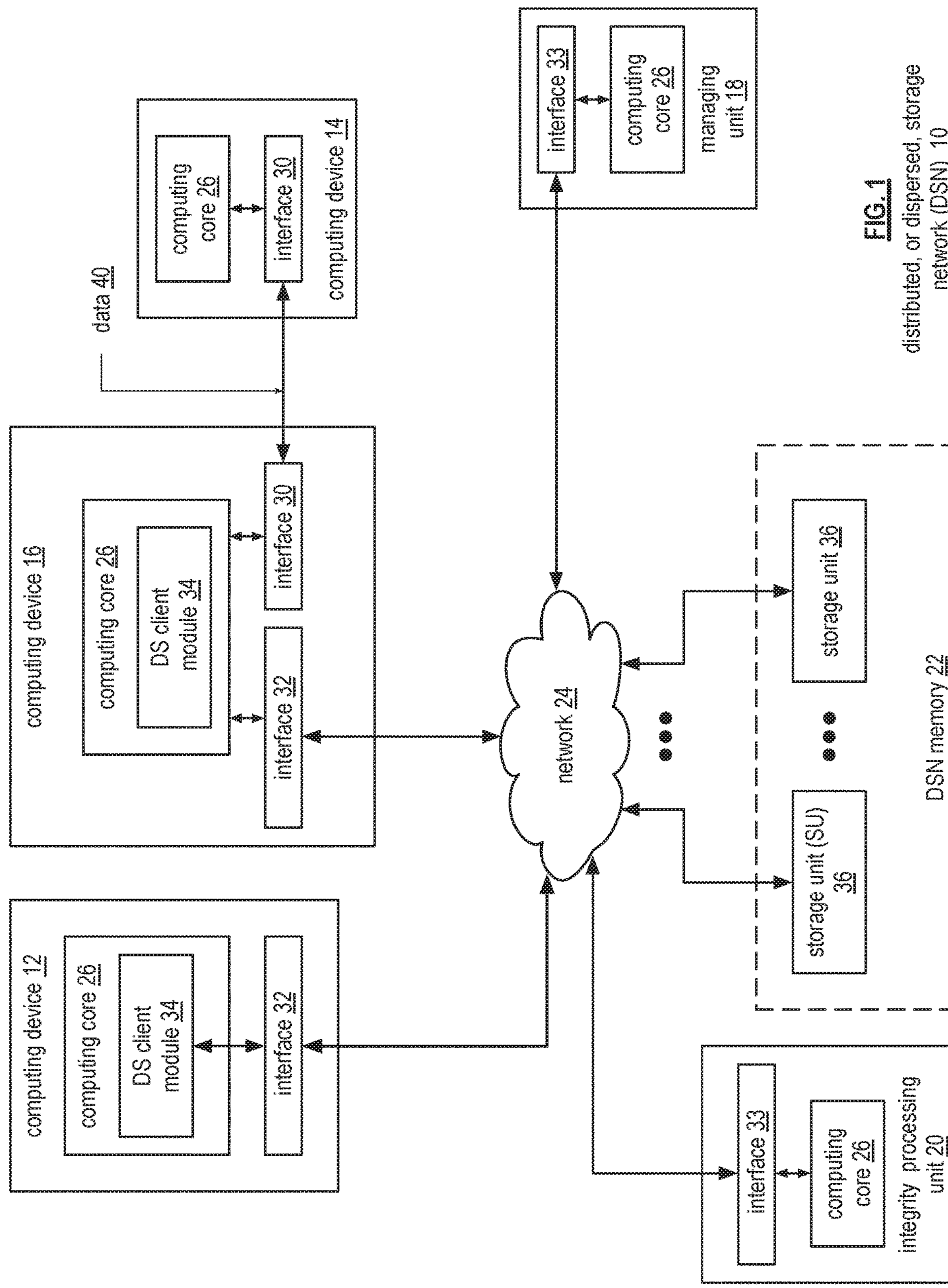
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
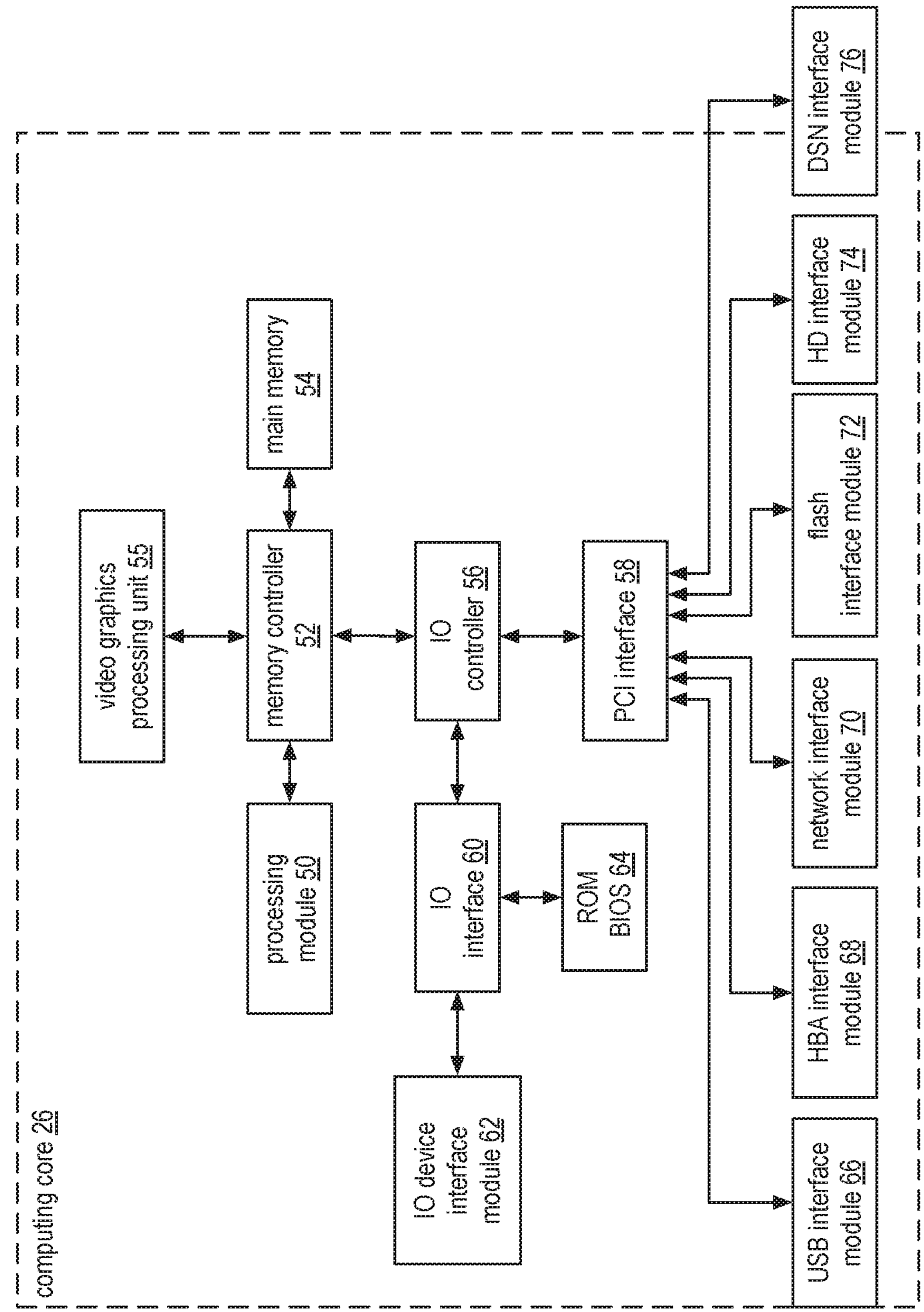
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
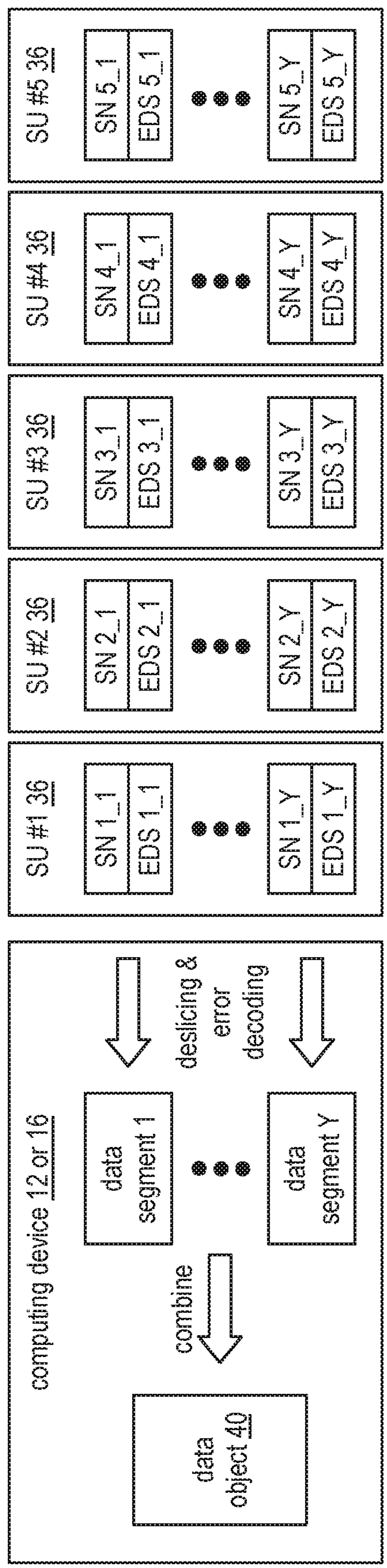
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
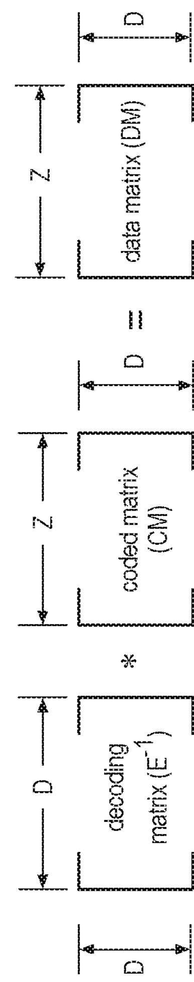
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
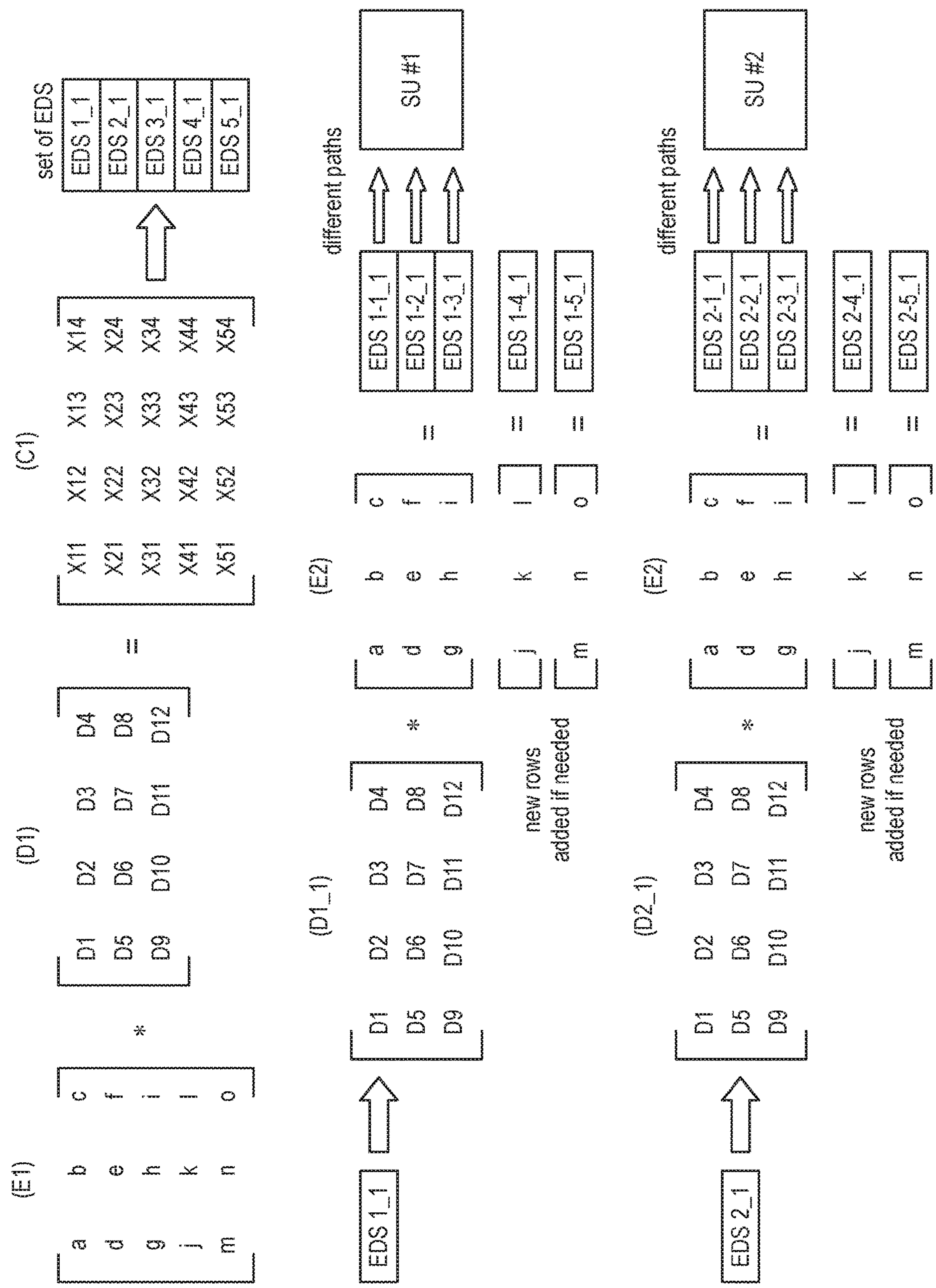
FIG. 9 is a schematic block diagram illustrating an example of creating transmission encoded data slices in accordance with the present invention.

FIG. 9 is a schematic block diagram illustrating an example of creating transmission encoded data slices. Similar to the example shown in FIG. 5, this diagram illustrates a specific example of Cauchy Reed-Solomon encoding with a pillar number of 5 and decode threshold number of 3. In this example, a first data segment is divided into twelve data blocks (D1-D12) to form a data matrix (D1). A set of encoded data slices (EDSs) is produced by matrix multiplying the data matrix by an encoding matrix (E1).

An encoded data slice (e.g., EDS 1_1) of the set of encoded data slices is arranged into data blocks of the encoded data slice to form a second data matrix (e.g., D1_1). The second matrix is then multiplied with a second encoding matrix (E2) to produce a set of transmission data slices. In one example, the second encoding matrix is substantially similar to the encoding matrix; in another example they are different. The second encoding matrix (E2) is shown in three sections: an unity matrix section, a first redundant section (e.g., a row with coefficients j, k, and l), and a second reduction section (e.g., a row with coefficients m, n, and o). Within the unity matrix section, coefficients a, e, and i equal 1 and the remaining coefficients b, c, d, f, g, and h equal 0. In this manner, when the data matrix D1_1 is multiplied by the unity matrix portion of the second encoding matrix (E2), the resulting transmission data slices (e.g., EDS 1-1_1-1-3_1) are the equivalents of corresponding rows of the data matrix D1_1. For example, EDS 1-1_1 includes D1, D2, D3, and D4 of the data matrix D1_1.

EDS 1-1_1-1-3_1 of the set of transmission data slices are a decode threshold number of transmission data slices and are sent to a storage unit (e.g., SU #1) through a plurality of paths. For example, EDS 1-1_1 is sent to storage unit #1 through a first path, EDS 1-2_1 is sent to storage unit #1 through a second path, and EDS 1-3_1 is sent to storage unit #1 through a third path. If the storage unit receives all three transmission data slices (e.g., EDS 1-1_1-1-3_1), it has the full encoded data slice EDS 1_1.

If a storage unit (e.g., SU #1) does not receive one or more of the decode threshold number of transmission data slices (e.g., due to a bad path), a previously transmitted transmission data slice but not received slice is resent via a known valid path (e.g., a path associated with a received transmission data slice) or via a new path. Alternatively, another transmission data slice (e.g., one created by multiplying a redundancy row (e.g., coefficients j, k, and l) of the second encoding matrix with the data matrix D1_1) may be created and sent to the storage unit.

If all of the transmission data slices have been sent and the storage unit still has not received a decode threshold number of slices, a row is added to the second encoding matrix. The additional row (e.g., coefficients m, n, and o) is then matrix multiplied by the data matrix D1_1 to produce the new transmission data slice (e.g. EDS 1-5_1). The new transmission data slice is sent to the storage unit via a known valid path or a new path and a record of transmitting the new transmission data slice is created (e.g., for use during a retrieval operation so that a requesting device knows to recover the encoded data slice related to the new transmission data slice prior to decoding to recover the data segment related to the encoded data slice).

Figure 10:
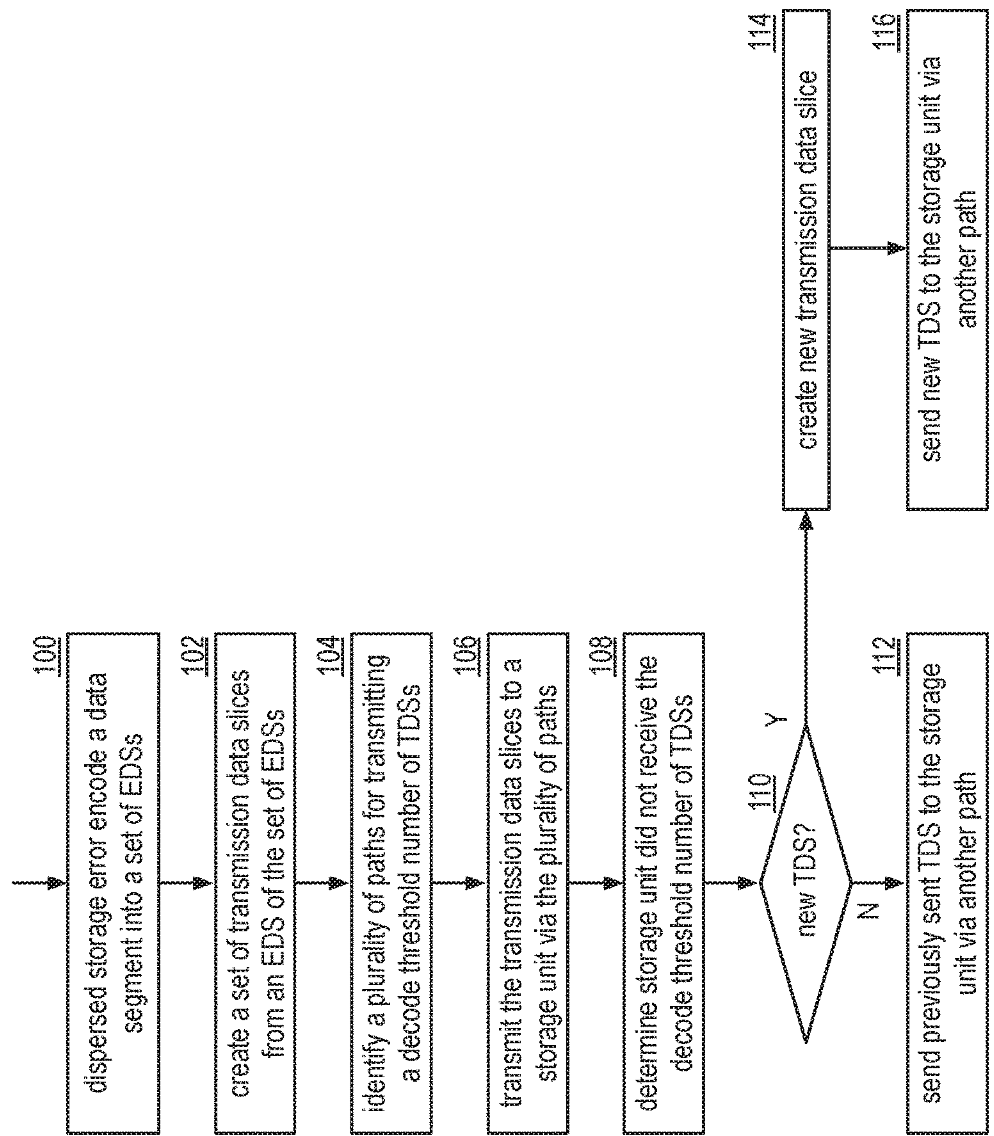
FIG. 10 is a logic flow diagram of an example of a method of creating transmission encoded data slices in accordance with the present invention.

FIG. 10 is a logic flow diagram of an example of a method of creating transmission data slices. The method begins with step 100, where a computing device dispersed storage error encodes a data segment of data into a set of encoded data slices. In this example, the data blocks of the data segment are arranged into a data matrix and the data matrix is then multiplied by an encoding matrix to create the set of encoded data slices.

The method continues with step 102, where the computing device creates a set of transmission encoded data slices from an encoded data slice of the set of encoded data slices. For example, for an encoded data slices of the set of encoded data slices, the computing device arranges data blocks of the encoded data slices in a second data matrix. The computing device then multiplies the second data matrix with a second encoding matrix that includes a unity matrix portion to produce a set of transmission data slices. A decode threshold number of transmission data slices of the set of transmission data slices correspond to the unity matrix portion of the second encoding matrix. In one instance, the second encoded matrix is substantially the same as the first encoding matrix.

As another example, the computing device arranges data blocks of a second encoded data of the set of encoded data slices into a third data matrix, and multiplies the third data matrix with a third encoding matrix to produce a second set of transmission data slices. Note the third encoding matrix may be substantially the same as the second encoding matrix.

The method continues to step 104, where the computing device identifies a plurality of paths for transmitting a decode threshold number of transmission data slices of the set of transmission data slices to a storage unit of the DSN. For example, for the second set of transmission data slices, the computing device identifies a second plurality of paths for transmitting the decode threshold number of transmission data slices to a second storage unit of the DSN.

The method continues with step 106, where the computing device transmits the decode threshold number of transmission data slices to the storage unit via the plurality of paths. For example, the computing device transmits the decode threshold number of transmission data slices of the second set of transmission data slices to the second storage unit via the second plurality of paths.

The method continues to step 108, where the computing device determines the storage unit did not receive the decode threshold number of transmissions data slices. For example, the computing device receives a request for another transmission data slice from the storage unit. As another example, the computing device receives an indication of received transmission data slices from the storage unit and determines that the storage unit did not receive the decode threshold number of transmission data slices.

The method continues to step 110, where the computing device determines whether to create a transmission data slice. For example, to increase security, the computing device determines to create a new transmission data slice when the storage unit requests another transmission data slice. As another example, for faster processing, the computing device determines to resend transmission data slices not received to the storage unit through a known valid path. When the computing device determines not to create a new transmission data slice, the method continues to step 112, where the computing device sends a previously sent transmission data slice via another path (e.g., a known valid path or a new path).

When the computing device determines to create a new transmission data slice, the method continues to step 114, where the computing device creates a new transmission data slice. For example, the computing device adds a new row to the second encoding matrix and multiplies the new row by the second data matrix to produce the new transmission data slice. The method continues to step 116, where the computing device sends the new transmission data slice to the storage unit via another path (e.g., a known valid path or a new path). Note the computing device also records the new transmission data slice so that upon retrieval, the requesting device knows to recover the encoded data slice related to the new transmission data slice before attempting to recover a data segment related to the encoded data slice.

Figure 11A:
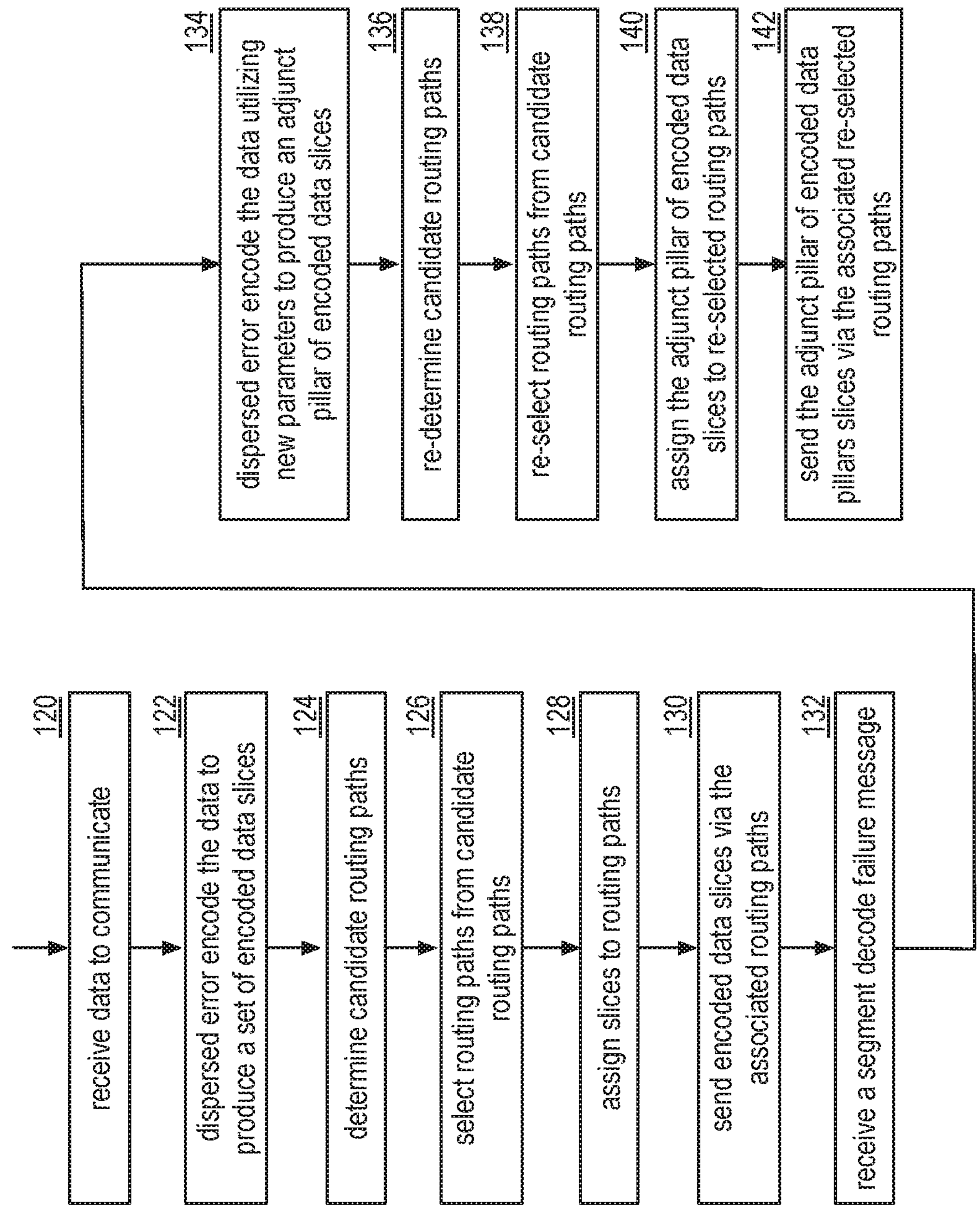
FIG. 11A is another flowchart illustrating another example of sending data as slices in accordance with the present invention.

FIG. 11A is another flowchart illustrating another example of sending data as slices. The method begins with step 120, where a processing module (e.g., of a sending computing device) receives data to communicate. Note that the data may include any type of analog or digital representation of data content, media content, video, audio, speech, word processing files, financial records, software, etc. In an example, the processing module facilitates communications of the data to a receiving computing device, via a network and a plurality of relay units, where the data is re-produced by the receiving computing device.

The method continues at step 122, where the processing module dispersed storage error encodes the data utilizing an error coding dispersal storage function to produce a set of encoded data slices. The method continues at step 124, where the processing module obtains routing path quality of service information and determines candidate routing paths as previously discussed. The method continues at step 126, where the processing module selects routing paths from the candidate routing paths as previously discussed. The method continues at step 128, where the processing module assigns a set of encoded data slices to the selected routing paths as previously discussed.

The method continues at step 130, where the processing module sends the set of encoded data slices via the associated routing paths. Note that the processing module may not send encoded data slices of a particular pillar when processing module determines to lower network bandwidth utilization. The method continues at step 132, where the processing module receives a segment decode failure message. Note that the message may include one or more of a failure indicator, a data segment identifier, one or more slice names, a source name, a receiving computing device identifier, one or more relay unit identifiers, and a routing path identifier. The method continues at step 134, where the processing module dispersed error encodes the data utilizing new error coding dispersal storage function parameters to produce an adjunct pillar of encoded data slices. In an example, the processing module encodes the data with new parameters where the new parameters include an additional one or more pillars (e.g., such that the previous slices are still usable to decode data segments).

The method continues at step 136, where the processing module re-determines candidate routing paths as previously discussed. Note that the same number of routing paths may not be required. In an example, the processing module re-determines candidate routing paths such that the resulting re-selected routing paths do not include any failed paths as indicated by the data segment decode failure message. The method continues at step 138, where the processing module re-selects routing paths from candidate routing paths as previously discussed. Note that the processing module chooses the routing paths best meet communication requirement with the currently available routing paths.

The method continues at step 140, where the processing module assigns at least some of the adjunct pillar of encoded data slices to the re-selected routing paths. In an example, the processing module assigns re-selected routing paths to the adjunct pillar of encoded data slices that represent information bytes to enable more rapid decoding of the data segment by the receiving computing device. The method continues at step 142, where the processing module re-sends at least some of the adjunct pillar of encoded data slices via the associated re-selected routing paths.

In an example of operation of a receiving computing device, the method begins where a processing module of the receiving computing device receives a slice of a new data segment. The processing module starts a receive timer. The processing module creates and sends a data segment failure message when the timer expires and less than a threshold number of slices have been received.

Figure 11B:
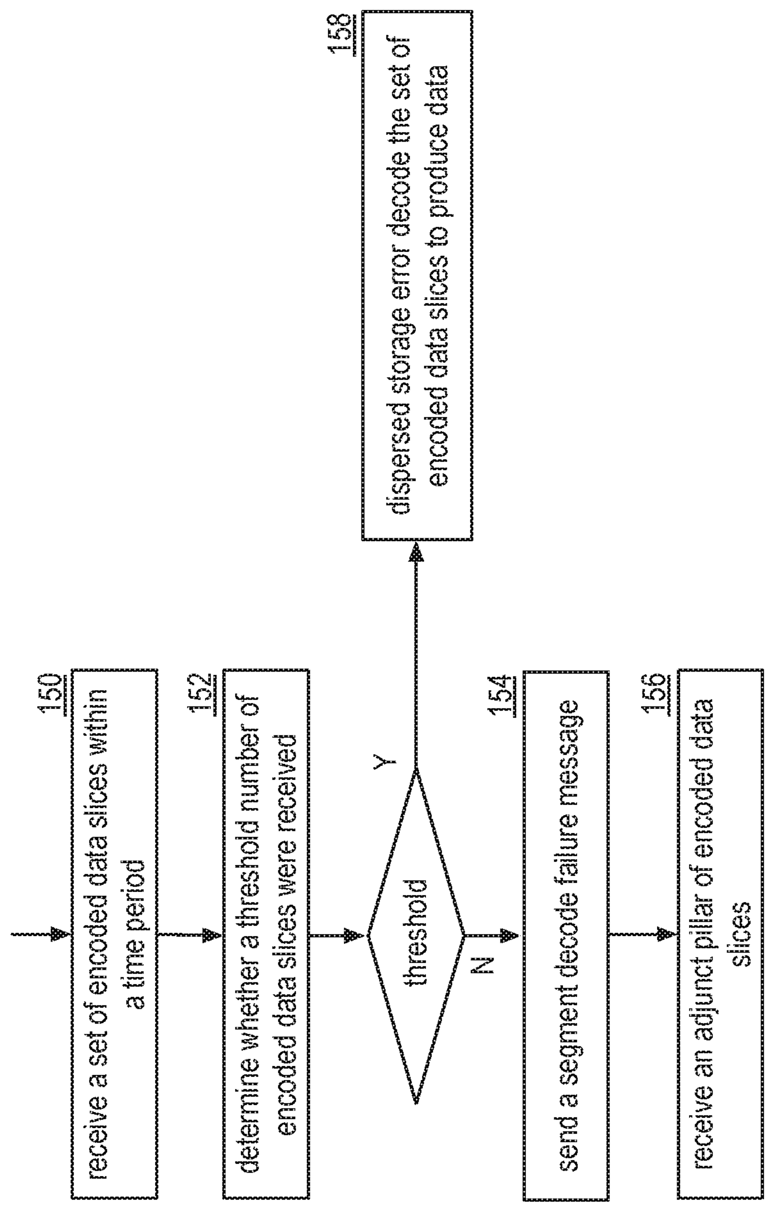
FIG. 11B is another flowchart illustrating another example of dispersed storage error decoding encoded data slices in accordance with the present invention.

FIG. 11B is another flowchart illustrating another example of dispersed storage error decoding encoded data slices. The method begins with step 150, where a processing module receives a set of encoded data slices within a time period. The method continues with step 152, where the processing module determines whether a threshold number of encoded data slices were received. When the processing module determines that the threshold number of encoded data slices were not received, the method continues with step 154 where the processing module sends the segment decode failure message. Note that such a message may invoke a sender to send an additional slice of an additional pillar as described with reference to FIG. 11A. In addition, the processing module may save the set of encoded data slices received so far to subsequently utilize in addition to further received encoded data slices to attempt to decode the data.

The method continues at step 156, where the processing module receives an adjunct pillar of encoded data slices. When the processing module determines that the threshold number of encoded data slices were received, the method branches to step 158, where the processing module dispersed storage error decodes the set of encoded data slices to produce data.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a computing device of a dispersed or distributed storage network (DSN), the method comprises:

dispersed storage error encoding a data segment of data into a set of encoded data slices, wherein data blocks of the data segment are arranged into a data matrix, and wherein the data matrix is multiplied by an encoding matrix to create the set of encoded data slices; and for an encoded data slice of the set of encoded data slices;

arranging data blocks of the encoded data slice into a second data matrix; and multiplying the second data matrix with a second encoding matrix to produce a set of transmission data slices, wherein the second encoding matrix includes a unity matrix portion;

identifying a plurality of paths for transmitting a decode threshold number of transmission data slices of the set of transmission data slices to a storage unit of the DSN, wherein the decode threshold number of transmission data slices correspond to the unity matrix portion of the second encoding matrix; and transmitting the decode threshold number of transmission data slices to the storage unit via the plurality of paths.

2. The method of claim 1 further comprises:

the second encoding matrix being the same as the first encoding matrix.

3. The method of claim 1 further comprises:

receiving, from the storage unit, a request for another transmission data slice; and sending the other transmission data slice to the storage unit via another path.

4. The method of claim 3 further comprises:

recording transmission of the other transmission data slice.

5. The method of claim 1 further comprises:

receiving from the storage unit, an indication of received transmission data slices;

determining that the storage unit did not receive the decode threshold number of transmission data slices; and sending one or more of:

a previously sent transmission data slice via a known valid path;

the previously sent transmission data slice via a new path;

a new transmission data slice via the known valid path; and the new transmission data slice via the new path.

6. The method of claim 1 further comprises:

when the set of transmission data slices have been sent and the storage unit has requested further transmission data slices;

adding a new row to the second encoding matrix; and multiplying the new row by the second data matrix to produce a new transmission data slice;

sending the new transmission data slice to the storage unit.

7. The method of claim 1 further comprises:

arranging data blocks of a second encoded data slice of the set of encoded data slices into a third data matrix;

multiplying the third data matrix with the second encoding matrix to produce a second set of transmission data slices;

identifying a second plurality of paths for transmitting the decode threshold number of transmission data slices of the second set of transmission data slices to a second storage unit of the DSN; and transmitting the decode threshold number of transmission data slices of the second set of transmission data slices to the second storage unit via the second plurality of paths.

8. The method of claim 1 further comprises:

the first encoding matrix being different than the second encoding matrix.

9. A computing device comprises:

an interface;

memory; and a processing module operably coupled to the interface and memory, wherein the processing module is operable to:

dispersed storage error encode a data segment of data into a set of encoded data slices, wherein data blocks of the data segment are arranged into a data matrix, and wherein the data matrix is multiplied by an encoding matrix to create the set of encoded data slices; and for an encoded data slice of the set of encoded data slices;

arrange data blocks of the encoded data slice into a second data matrix; and multiply the second data matrix with a second encoding matrix to produce a set of transmission data slices, wherein the second encoding matrix includes a unity matrix portion;

identify a plurality of paths for transmitting a decode threshold number of transmission data slices of the set of transmission data slices to a storage unit of a dispersed or distributed storage network (DSN), wherein the decode threshold number of transmission data slices correspond to the unity matrix portion of the second encoding matrix; and transmit the decode threshold number of transmission data slices to the storage unit via the plurality of paths.

10. The computing device of claim 9 further comprises:

the second encoding matrix being the same as the first encoding matrix.

11. The computing device of claim 9, wherein the processing module further functions to:

receive, via the interface from the storage unit, a request for another transmission data slice; and send, via the interface, the other transmission data slice to the storage unit via another path.

12. The computing device of claim 11, wherein the processing module further functions to:

record transmission of the other transmission data slice.

13. The computing device of claim 9, wherein the processing module further functions to:

receive, via the interface, from the storage unit, an indication of received transmission data slices;

determine that the storage unit did not receive the decode threshold number of transmission data slices; and send, via the interface, one or more of:

a previously sent transmission data slice via a known valid path;

the previously sent transmission data slice via a new path;

a new transmission data slice via the known valid path; and the new transmission data slice via the new path.

14. The computing device of claim 9, wherein the processing module further functions to:

when the set of transmission data slices have been sent via the interface and the storage unit has requested further transmission data slices;

add a new row to the second encoding matrix; and multiply the new row by the second data matrix to produce a new transmission data slice;

send, via the interface, the new transmission data slice to the storage unit.

15. The computing device of claim 9, wherein the processing module further functions to:

arrange data blocks of a second encoded data slice of the set of encoded data slices into a third data matrix;

multiply the third data matrix with the second encoding matrix to produce a second set of transmission data slices;

identify a second plurality of paths for transmitting the decode threshold number of transmission data slices of the second set of transmission data slices to a second storage unit of the DSN; and transmit, via the interface, the decode threshold number of transmission data slices of the second set of transmission data slices to the second storage unit via the second plurality of paths.

16. The computing device of claim 15 further comprises:

the first encoding matrix being different than the second encoding matrix.

* * * * *